(12) United States Patent
Buller et al.

(10) Patent No.: US 6,936,506 B1
(45) Date of Patent: Aug. 30, 2005

(54) STRAINED-SILICON DEVICES WITH DIFFERENT SILICON THICKNESSES

(75) Inventors: James F. Buller, Austin, TX (US); Derick J. Wristers, Bee Caves, TX (US); Qi Xiang, San Jose, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/442,975

(22) Filed: May 22, 2003

(51) Int. Cl.[7] ............................................. H01L 21/336
(52) U.S. Cl. ........................ 438/197; 438/199; 438/275
(58) Field of Search ................................ 438/197, 199, 438/275, 279, 172

(56) References Cited

U.S. PATENT DOCUMENTS

| | | | |
|---|---|---|---|
| 6,339,232 B1 * | 1/2002 | Takagi | 257/192 |
| 6,600,170 B1 * | 7/2003 | Xiang | 257/18 |
| 2003/0013287 A1 * | 1/2003 | Lochtefeld et al. | 438/590 |
| 2003/0062586 A1 * | 4/2003 | Wallace et al. | 257/506 |
| 2003/0077867 A1 * | 4/2003 | Fitzgerald | 438/285 |
| 2003/0227013 A1 * | 12/2003 | Currie et al. | 257/19 |
| 2004/0171223 A1 * | 9/2004 | Hammond et al. | 438/285 |
| 2004/0175872 A1 * | 9/2004 | Yeo et al. | 438/154 |

* cited by examiner

Primary Examiner—Tuan H. Nguyen

(57) ABSTRACT

A method of manufacturing a semiconductor device includes providing a strained-silicon semiconductor layer over a silicon germanium layer, and partially removing a first portion of the strained-silicon layer. The strained-silicon layer includes the first portion and a second portion, and a thickness of the second portion is greater than a thickness of the first portion. Initially, the first and second portions of the strained-silicon layer initially can have the same thickness. A p-channel transistor is formed over the first portion, and a n-channel transistor is formed over the second portion. A semiconductor device is also disclosed.

14 Claims, 5 Drawing Sheets

US 6,936,506 B1

STRAINED-SILICON DEVICES WITH DIFFERENT SILICON THICKNESSES

FIELD OF THE INVENTION

The present invention relates to the manufacturing of semiconductor devices, and more particularly, to forming strained-silicon devices having improved characteristics.

BACKGROUND OF THE INVENTION

Over the last few decades, the semiconductor industry has undergone a revolution by the use of semiconductor technology to fabricate small, highly integrated electronic devices, and the most common semiconductor technology presently used is silicon-based. A large variety of semiconductor devices have been manufactured having various applications in numerous disciplines. One silicon-based semiconductor device is a metal-oxide-semiconductor (MOS) transistor. The MOS transistor is one of the basic building blocks of most modem electronic circuits. Importantly, these electronic circuits realize improved performance and lower costs, as the performance of the MOS transistor is increased and as manufacturing costs are reduced.

A typical MOS device includes a bulk semiconductor substrate on which a gate electrode is disposed. The gate electrode, which acts as a conductor, receives an input signal to control operation of the device. Source and drain regions are typically formed in regions of the substrate adjacent the gate electrodes by doping the regions with a dopant of a desired conductivity. The conductivity of the doped region depends on the type of impurity used to dope the region. The typical MOS device is symmetrical, in that the source and drain are interchangeable. Whether a region acts as a source or drain typically depends on the respective applied voltages and the type of device being made. The collective term source/drain region is used herein to generally describe an active region used for the formation of either a source or drain.

As an alternative to forming a MOS device directly on a bulk semiconductor substrate, the MOS device can be formed on a strained-silicon layer. The process for forming strained-silicon involves depositing a layer of silicon germanium (SiGe) on the bulk semiconductor substrate. A thin layer of silicon is subsequently deposited on the SiGe layer. The distance between atoms in a SiGe crystal lattice is greater than the distance between atoms in an ordinary silicon crystal lattice. However, there is a natural tendency of atoms inside different types of crystals to align with one another where one crystal is formed on another crystal. As such, when a crystal lattice of silicon is formed on top of a layer of SiGe, the atoms in the silicon crystal lattice tend to stretch or "strain" to align with the atoms in the SiGe lattice. A resulting advantage of such a feature is that the strained silicon experiences less resistance to electron flow and produces gains of up to 80% in speed as compared to ordinary crystalline silicon.

MOS devices using a strained-silicon structure typically fall in one of two groups depending on the type of dopants used to form the source, drain and channel regions. The two groups are often referred to as n-channel and p-channel devices. The type of channel is identified based on the conductivity type of the channel which is developed under the transverse electric field. In an n-channel MOS (NMOS) device, for example, the conductivity of the channel under a transverse electric field is of the conductivity type associated with negatively charged electrons. Conversely, the channel of a p-channel MOS (PMOS) device under the transverse electric field is associated with positively charged holes.

One consideration when manufacturing NMOS and PMOS strained-silicon transistors is maintaining a proper channel length. The channel length can be shortened, for example, if the source/drain regions are exposed to excessive temperature and/or time during activation. This causes excess lateral diffusion of the dopants, which causes the channel length to shorten. NMOS and PMOS transistors are formed on a single chip and are therefore exposed to the same temperature/time profile during dopant activation. However, because the NMOS and PMOS transistors are formed using different dopants, which likely have different diffusion characteristics, the temperature/time profile for at least one of the NMOS or PMOS transistors will not be optimized. For example, the diffusivity in silicon of boron, a p-type dopant, is significantly greater than the diffusivity in silicon of arsenic, a n-type dopant. This creates a concern in semiconductor devices that contain both n-channel and p-channel transistors. Accordingly, a need exists for an improved method of forming devices on a strained-silicon structure that allows for improved performance and allows for separate optimization of separate transistors formed on the strained-silicon structure.

SUMMARY OF THE INVENTION

This and other needs are met by embodiments of the present invention which provide a method of manufacturing a semiconductor device that improves performance and allows for separate optimization of separate transistors formed on a strained-silicon structure. The method includes providing a strained-silicon layer over a silicon germanium layer, and partially removing a first portion of the strained-silicon layer. The strained-silicon layer includes the first portion and a second portion, and a thickness of the second portion is greater than a thickness of the first portion. Initially, the first and second portions of the strained-silicon layer can have the same thickness.

In another aspect of the invention, the first portion of the strained-silicon layer is partially removed by etching. The partial removal of the first portion of the strained-silicon layer can also include depositing a resist over the strained-silicon layer and exposing and developing the resist to expose the first portion of the strained-silicon layer. The thickness of the first portion is determined by etching the first portion for a predetermined length of time.

In still another aspect of the invention, the first portion of the strained-silicon layer is partially removed by oxidizing the first portion of the strained-silicon layer and removing the oxidized silicon. The partial removal of the first portion of the strained-silicon layer can also include depositing a mask layer and a resist over the strained-silicon layer and exposing and developing the resist to expose a portion of the mask layer over the first portion of the strained-silicon layer and removing the mask layer over the first portion of the strained-silicon layer. After partially removing the first portion, the mask layer can then be removed.

Isolating features can be formed before or after the first portion of the strained-silicon layer is partially removed. Also, a first transistor can be formed in the first portion and a second transistor can be formed in the second portion. The first transistor can include source/drain regions formed with a first dopant and the second transistor can include source/drain regions formed with a second dopant, and the diffusivity of the second dopant into silicon is greater than the diffusivity of the first dopant into silicon. The first transistor can be a p-channel transistor, and the second transistor can be a n-channel transistor. The first portion has a thickness of between about 5 nanometers and about 20 nanometers, and the second portion has a thickness of between about 10 nanometers and about 40 nanometers.

In another embodiment of the present invention, a semiconductor device is provided. The semiconductor device includes a strained-silicon layer over a silicon germanium layer. The strained-silicon layer includes a first portion and a second portion, and a thickness of the second portion is greater than a thickness of the first portion. A p-channel transistor is formed over the first portion, and a n-channel transistor is formed over the second portion.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

Figure 1A:
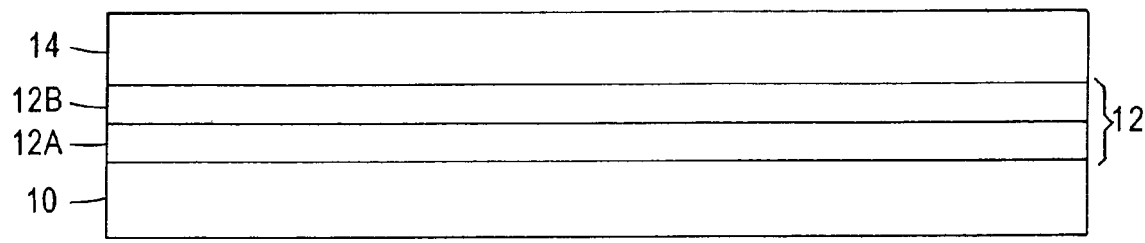
FIGS. 1A–1D schematically illustrate sequential phases of a strained-silicon fabrication method according to one embodiment of the present invention.

The present invention improves performance and allows for separate optimization of separate transistors formed on a strained-silicon structure. This is achieved, in part, by providing a semiconductor device having different portions, with each portion having a strained-silicon layer, and a thickness of one portion of the strained-silicon layer differing from another portion of the strained-silicon layer. In so doing, the thickness of portions of the strained-silicon layer can be optimized depending upon factors, such as the diffusion characteristics of the dopants used to form the transistors.

Embodiments of the present invention are illustrated in FIGS. 1–4. FIGS. 1A and 2A illustrate a conventional strained-silicon structure. The strained-silicon structure includes a silicon germanium layer 12 formed over a substrate 10, and a strained-silicon semiconductor layer 14 formed on the silicon germanium layer 12. The invention, however, is not limited as to the manner in which the strained-silicon structure is formed.

An exemplary method of forming a strained-silicon structure is as follows. The substrate 10 can be a silicon wafer having a thickness of approximately 100 nanometers. The silicon germanium layer 12 is formed over the substrate 10 using a chemical vapor deposition (CVD) process, such as ultra-high vacuum chemical vapor deposition (UHVCVD). The silicon germanium layer 12 can comprise a sublayer 12A, in which the concentration of Ge in the sublayer 12A is graded from about 0% Ge at the silicon germanium layer 12/substrate 10 interface to a maximum concentration of about 30% Ge. In certain aspects, the maximum concentration of Ge is about 20% Ge. Also, the thickness of the graded-concentration sublayer 12A can be about 2 nanometers.

After the maximum desired concentration of Ge is achieved in the first sublayer 12A, a second silicon germanium sublayer 12B having a substantially constant Ge concentration is formed on the first sublayer 12A. The second germanium sublayer 12B, although not limited in this manner, has a thickness between about 1 nanometers and about 2 nanometers. The resulting silicon germanium layer, therefore, can have an overall thickness of between about 3 nanometers and about 4 nanometers. The concentration of Ge in the constant-concentration sublayer 12B is substantially equal to the maximum Ge concentration in the graded-concentration sublayer 12A.

The strained silicon layer 14 is an epitaxial layer formed, for example, by CVD. The atoms in the silicon layer 14 stretch apart from each other in order to align themselves with the underlying lattice structure of the silicon germanium layer 12. Electron flow in this resulting strained silicon layer 14 is advantageously much faster than in ordinary crystalline silicon. Although not limited in this manner, the thickness of the strained silicon layer is between about 20 nm to about 40 nm. Furthermore, in a current aspect of the present invention, the thickness of the silicon layer 14 can be optimized for particular individual devices formed on the wafer. In this manner, a semiconductor device can be provided with different portions, each portion having a silicon layer 14 with a thickness that differs from another portion. The invention is also not limited in the manner in which the thickness of the silicon layer 14 of each portion is modified. Two exemplary methods of modifying the thickness of the silicon layer 14 are respectively illustrated in FIGS. 1A–D and 2A–D.

Figure 1B:
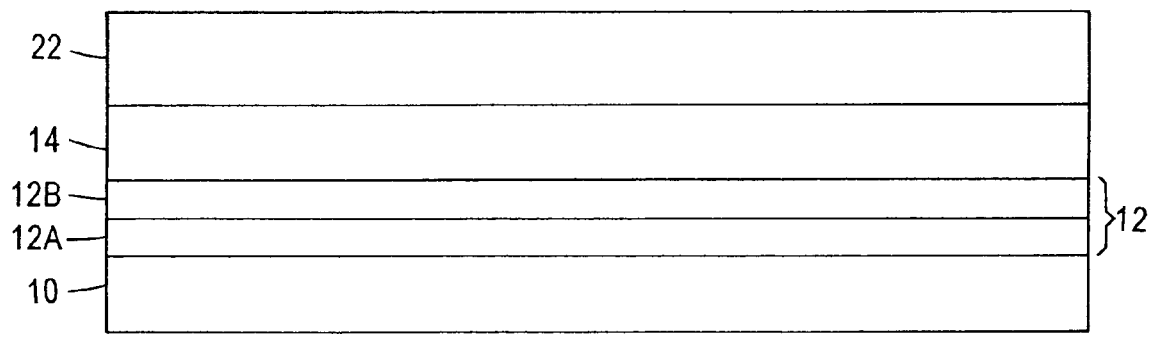
Figure 1C:
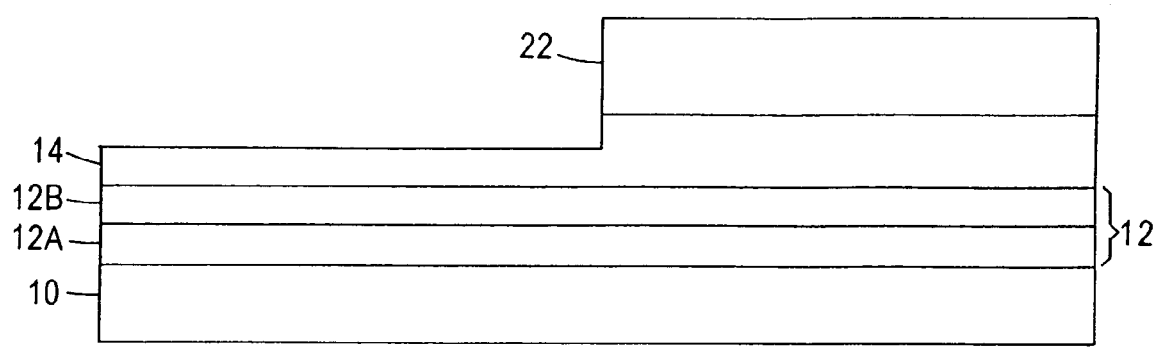

In FIG. 1B, a photoresist 22 is formed over the silicon layer 14, and in FIG. 1C, the photoresist 22 is selectively irradiated using a photolithographic system, such as a step and repeat optical projection system, in which ultraviolet light from a mercury-vapor lamp is projected through a first reticle and a focusing lens to obtain a first image pattern. The photoresist 22 is then developed, and the irradiated portions of the photoresist 22 are removed to provide openings in the photoresist 22. The openings expose portions of the silicon layer 14, which will thereby define the portions of the silicon layer 14 having a modified thickness. An etch, typically anisotropic, although not limited in this manner, is then applied to remove a certain thickness of the exposed portions of the silicon layer 14.

Figure 1D:
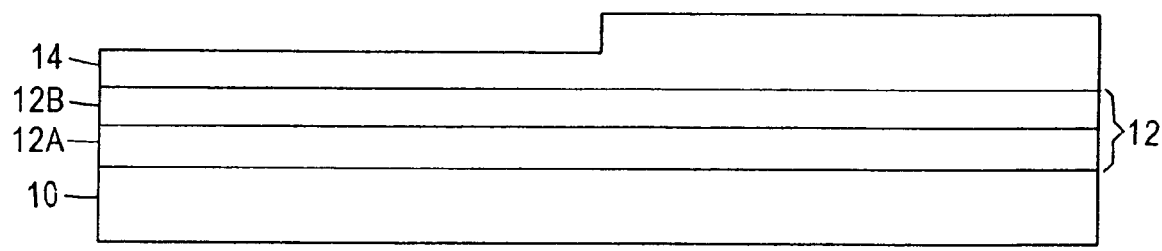

In FIG. 1D, the remaining photoresist 22 is removed, and a semiconductor device precursor having different portions with a silicon layer 14 of different respective thicknesses is provided. Once the photoresist 22 is removed, isolation features 18 (shown in FIGS. 3 and 4) can be provided in the silicon layer 14. The invention, however, is not limited in the manner in which the isolation features 18 are formed. For example, a shallow isolation trench can be formed by etching either isotropically with wet techniques or anisotropically with dry etch techniques. An oxide is thereafter deposited within the trench. As an alternative to the shallow isolation trench, a field oxide can be formed. A field oxide is typically formed via thermal oxidation in an oxygen-steam ambient at temperatures from about 850 to 1050° C. A patterned, oxidation-resistant mask can be used to prevent oxidation of non-isolation device regions. After formation of the field oxide, the mask is removed using known techniques, for example hot phosphoric acid for a silicon nitride mask or buffered hydrofluoric acid for a pad oxide mask.

Figure 2A:
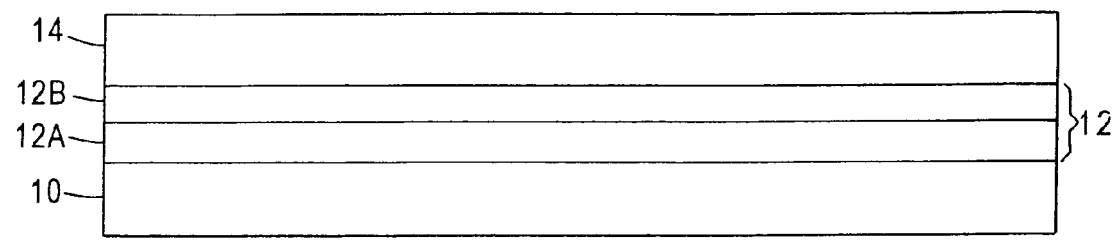
FIGS. 2A–2D schematically illustrate sequential phases of a strained-silicon fabrication method according to another embodiment of the present invention.
Figure 2B:
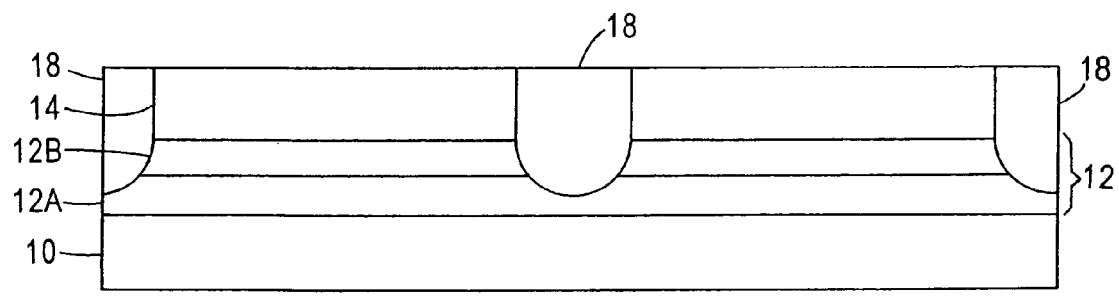

Alternatively, as illustrated in FIGS. 2A–2D, the isolation features 18 can be formed before the thickness of certain portions of the silicon layer 14 are modified. Furthermore, as also illustrated in FIGS. 2A–2D, a hard mask can be formed over the silicon layer 14 to aid in etching of the silicon layer 14. As illustrated in FIG. 2B, the isolation features 18 are formed in the silicon layer 14, and as described above, the invention is not limited in the manner in which the isolation features 18 are formed.

Figure 2C:
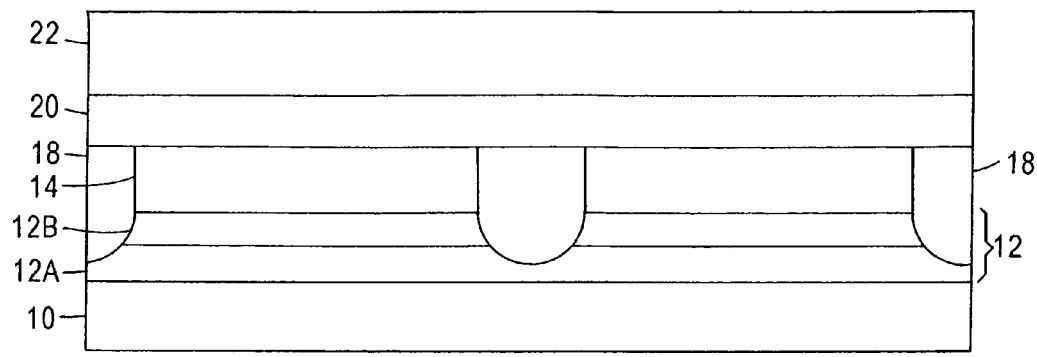

In FIG. 2C, a mask layer 20 is formed over the silicon layer 14, and the invention is not limited as to a particular mask layer 20. For example, the mask layer 20 can be formed from an anti-reflective film, which can be advantageously used during fine line patterning. In a current aspect, the mask layer 20 is formed from silicon nitride.

Figure 2D:
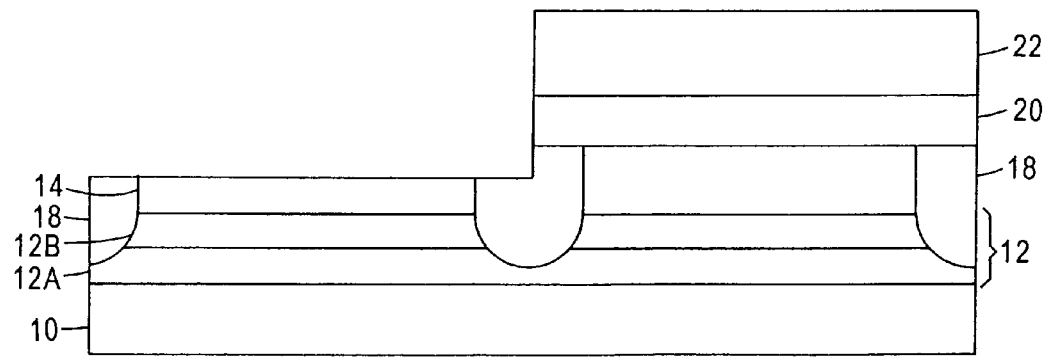

Upon formation of the mask layer 20, a photoresist 22 is formed over the mask layer 20. In FIG. 2D, the photoresist 22 is selectively irradiated using a photolithographic system, such as a step and repeat optical projection system, in which ultraviolet light from a mercury-vapor lamp is projected through a first reticle and a focusing lens to obtain a first image pattern. The photoresist 22 is then developed, and the irradiated portions of the photoresist 22 are removed to provide openings in the photoresist 22. The openings expose portions of the mask layer 20. A portion of the exposed mask layer 20 below the openings in the photoresist 22 is then removed, which exposes portions of the silicon layer 14 to be modified.

After portions of the mask layer 20 have been removed, the exposed portions of the silicon layer 14 are partially removed, and the invention is not limited in the manner in which the exposed portions of the silicon layer 14 are partially removed. For example, the exposed portions of the silicon layer 14 can be partially removed using an etch, such as an anisotropic etch. The amount of the exposed portions of the silicon layer 14 being removed can be determined, for example, by subjecting the exposed portions of the silicon layer 14 to the etch for a given time, as the removal rate of silicon for a given etchant is known. Another example of partially removing exposed portions of the silicon layer 14 involves oxidizing the exposed portions of the silicon layer 14 to form silicon oxide. The silicon oxide can then be removed leaving only the silicon layer 14. An advantage of using this process is that the consumption of silicon to form silicon oxide can be very closely controlled, and this allows for precise control of the partial removal of the exposed portions of the silicon layer 14.

Figure 3:
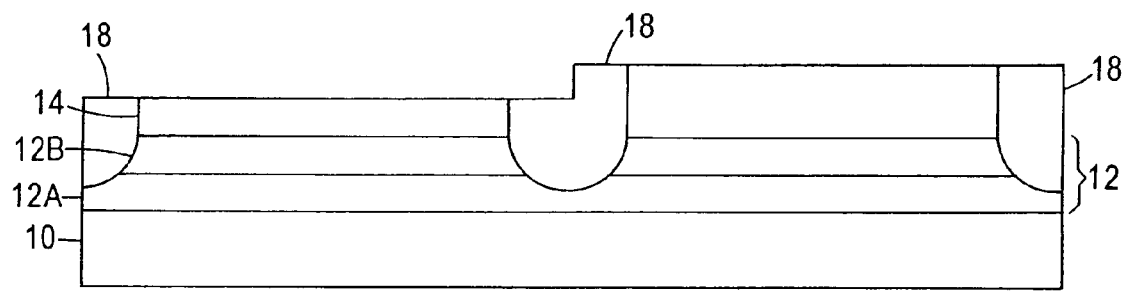
FIG. 3 schematically illustrates a strained-silicon semiconductor device having different portions with strained-silicon layers having different thicknesses.
Figure 4:
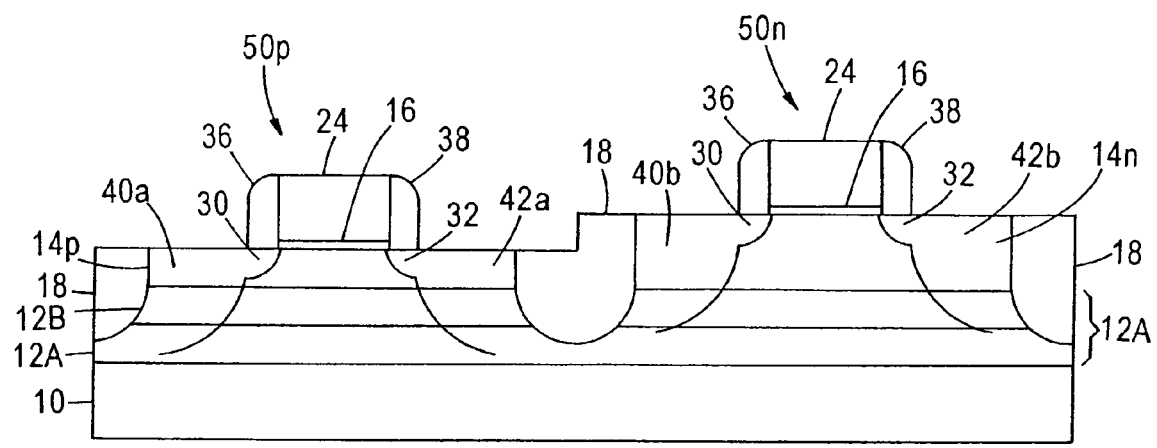
FIG. 4 illustrates the semiconductor device of FIG. 3 after features are formed on the strained-silicon layers having different thicknesses.

As illustrated in FIG. 3, after the remaining mask layer 20 and photoresist 22 is removed using techniques known to those skilled in the art, a semiconductor device having different portions, with each portion having a silicon layer 14 with a thickness that differs from another portion, is provided. Once the thickness of certain portions of the silicon layer 14 has been modified, features, such as transistors although not limited in this manner, can be formed in the silicon layer 14, as illustrated in FIG. 4.

The features, for example, can include a gate dielectric 16 and a gate electrode 24 over the gate dielectric 16. Sidewall spacers 36, 38 can be formed on sidewalls 26, 28 of the gate electrode 24, and source/drain extensions 30, 32 can be formed in the silicon layer 14 underneath the sidewall spacers 36, 38. Furthermore, source/drain regions 40, 42 can be formed in the silicon layer 14. As shown, the source/drain regions 40a, 42a in a first portion of the semiconductor device can have different depths than the source/drain regions 40b, 42b in a second portion of the semiconductor device.

By providing a semiconductor device having different portions, with each portion having a silicon layer with a thickness that differs from another portion, the formation of n-channel and p-channel transistors can be optimized. For example, a p-channel transistor $50_p$ with a dopant (e.g., boron) that has a greater diffusion rate in silicon can be formed on a portion $14_p$ of the silicon layer 14 having a smaller thickness than a portion $14_n$ of the silicon layer 14 upon which is formed a n-channel transistor $50_n$, with a dopant (e.g., arsenic) with a lower diffusion rate. Thus, the n-channel and p-channel transistors $50_n$, $50_p$ can both be exposed to an optimal temperature/time profile. The present invention takes advantage of boron having a lower diffusion rate in silicon germanium than in silicon, and conversely, arsenic and phosphorous having a greater diffusion rate in silicon germanium than in silicon. Thus, shallower source/drain regions 30, 32 for the n-channel and p-channel transistors $50_n$, $50_p$ can be provided by optimizing the thicknesses of the portions $14_n$, $14_p$ of the silicon layer 14 upon which the n-channel and p-channel transistors $50_n$, $50_p$ in consideration of the different diffusion rates of the dopants in silicon germanium as compared to the diffusion rates of the dopants in silicon.

The thicknesses of the portions $14_n$, $14_p$ of the silicon layer 14 upon which the n-channel and p-channel transistors $50_n$, $50_p$ are respectively formed are not limited as to a particular amount. However, in one aspect, the thickness of the portion $14_p$ of the silicon layer 14 upon which the p-channel transistor $50_p$ is formed can be between about 5 nanometers and about 20 nanometers, and the thickness of the portion $14_n$ of the silicon layer 14 upon which the n-channel transistor $50_n$ is formed can be between about 10 nanometers and about 40 nanometers.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well-known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concepts as expressed herein.

What is claimed is:

1. A method of manufacturing a semiconductor device, comprising the steps of:

providing a strained-silicon layer over a silicon germanium layer, the strained-silicon layer including a first portion and a second portion, the first and second portions having equal initial thicknesses across the silicon germanium layer;

partially removing the first portion of the strained-silicon layer such that a final thickness of the second portion is greater than a final thickness of the first portion; and forming a gate dielectric on and contacting the partially-removed first portion and the second portion of the strained-silicon layer.

2. The method according to claim 1, wherein the step of partially removing the first portion of the strained-silicon layer includes etching the first portion.

3. The method according to claim 2, wherein the step of partially removing the first portion of the strained-silicon layer includes depositing a resist over the strained-silicon layer and exposing and developing the resist to expose the first portion of the strained-silicon layer.

4. The method according to claim 2, wherein the final thickness of the first portion is determined by etching the first portion for a predetermined length of time.

5. The method according to claim 1, wherein the step of partially removing the first portion of the strained-silicon layer includes oxidizing the first portion of the strained-silicon layer and removing the oxidized silicon.

6. The method according to claim 5, wherein the step of partially removing the first portion of the silicon layer includes depositing a mask layer and a resist over the strained-silicon layer and exposing and developing the resist to expose a portion of the mask layer over the first portion of the strained-silicon layer and removing the mask layer over the first portion of the strained-silicon layer.

7. The method according to claim 6, further comprising the step of removing the mask layer.

8. The method according to claim 1, wherein isolating features are formed before the first portion of the silicon layer is partially removed.

9. The method according to claim 1, wherein isolating features are formed after the first portion of the silicon layer is partially removed.

10. The method according to claim 1, further comprising the step of forming a first transistor in the first portion and a second transistor in the second portion.

11. The method according to claim 10, wherein the first transistor includes first source/drain regions and the second transistor includes second source/drain regions formed, and a depth of the second source/drain regions is greater than a depth of the first source/drain regions.

12. The method according to claim 10, wherein the first transistor includes source/drain regions formed with a first dopant and the second transistor includes source/drain regions formed with a second dopant, and the diffusivity of the second dopant into silicon is greater than the diffusivity of the first dopant into silicon.

13. The method according to claim 10, wherein the first transistor is a p-channel transistor and the second transistor is a n-channel transistor.

14. A method of manufacturing a semiconductor device, comprising the steps of:

providing a strained-silicon layer over a silicon germanium layer, the strained-silicon layer including a first portion and a second portion, the first and second portions having equal initial thicknesses across the silicon germanium layer; and partially removing the first portion of the strained-silicon layer such that a final thickness of the second portion is greater than a final thickness of the first portion, wherein the final thickness of the first portion is between about 5 nanometers and about 20 nanometers, and the final thickness of the second portion is between about 10 nanometers and about 40 nanometers.

* * * * *